United States Patent
Berst et al.

(10) Patent No.: US 6,302,742 B1
(45) Date of Patent: Oct. 16, 2001

(54) ELECTRICAL INTERFACE PANEL

(76) Inventors: John Ray Berst, 21828 Knollwood Dr., Plainfield, IL (US) 60544; Kevin S. Reber, 2149 Paulette, Wolverine Lake, MI (US) 48390

( * ) Notice: Subject to any disclaimer, the term of this patent is extended or adjusted under 35 U.S.C. 154(b) by 0 days.

(21) Appl. No.: 09/586,288

(22) Filed: Jun. 2, 2000

(51) Int. Cl.[7] ................................................. H01R 25/00
(52) U.S. Cl. ..................... 439/638; 439/76.1; 439/639; 439/540.1
(58) Field of Search ..................... 439/638, 639, 439/76.1, 540.1, 470, 471, 719, 954

(56) References Cited

U.S. PATENT DOCUMENTS

| | | | |
|---|---|---|---|
| 4,767,338 | * 8/1988 | Dennis et al. | 439/76.1 |
| 4,782,245 | * 11/1988 | Henry | 439/954 |
| 5,167,530 | * 12/1992 | Wallgren et al. | 439/540.1 |
| 5,664,950 | * 9/1997 | Lawrence | 439/76.1 |
| 5,697,809 | * 12/1997 | Chung | 439/471 |

* cited by examiner

Primary Examiner—Tho D. Ta
(74) Attorney, Agent, or Firm—Emrich & Dithmar

(57) ABSTRACT

An electrical interface panel connects plural input connectors, or jacks, to plural output connectors such as in an asynchronous signal router as used with a computer-based global information network, such as the Internet. The interface panel includes a closed housing to which are attached plural SCSI multi-port connectors and either plural RJ45 multi-port connectors or plural D-sub connectors. In one embodiment, the SCSI multi-port connectors are connected to either the RJ45 mult-port connectors or D-sub connectors by a printed circuit (PC) board having appropriate sets of pinouts. In another embodiment, the SCSI connectors are connected to either the RJ45 or D-sub connectors by a pair of electrical cables. The connectors are disposed in and mounted to opposed walls of the housing, with the PC board or cables disposed within the closed housing to provide a compact, easily installed, point-to-point asynchronous signal router.

4 Claims, 3 Drawing Sheets

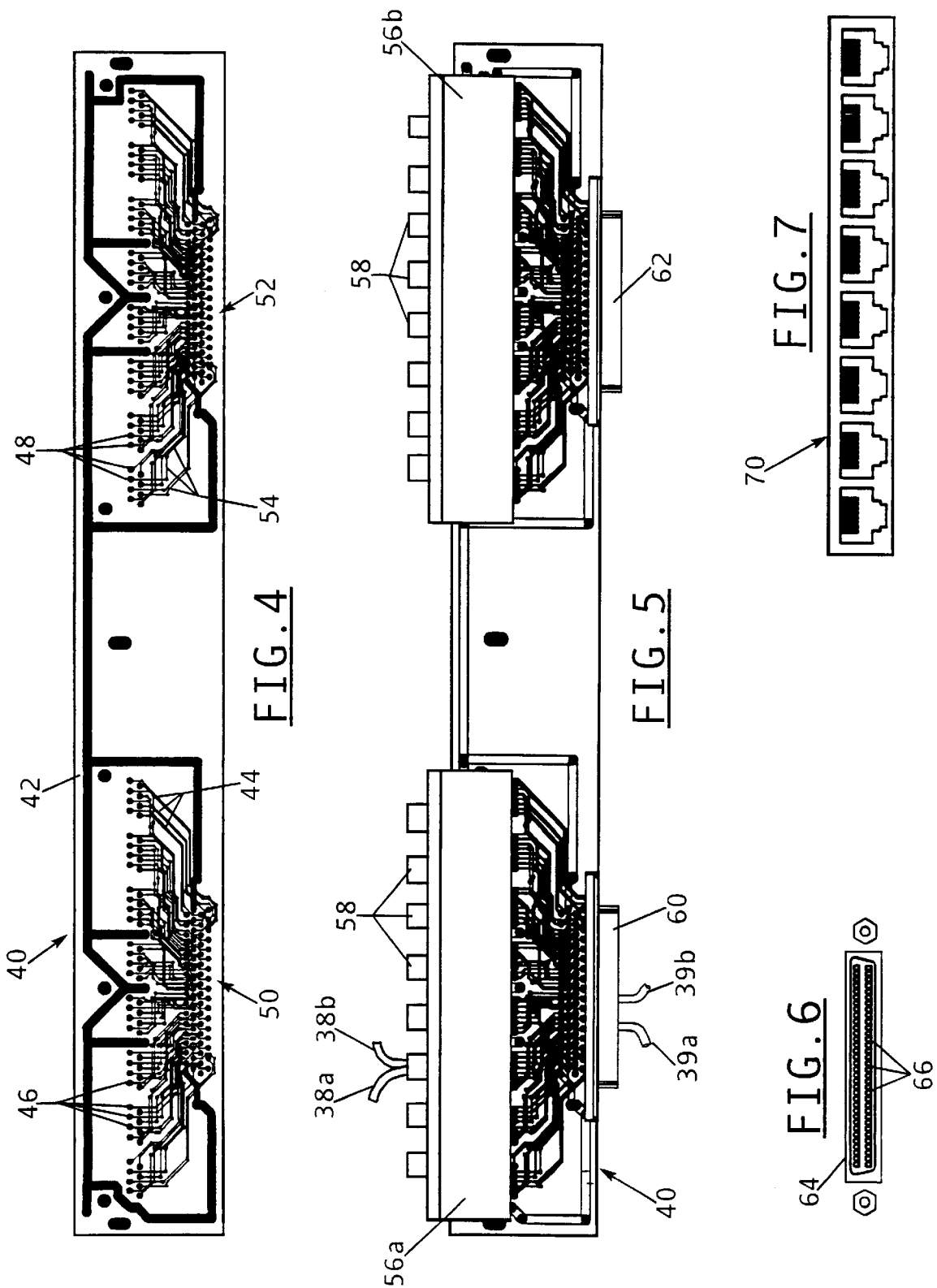

ELECTRICAL INTERFACE PANEL

FIELD OF THE INVENTION

This invention relates generally to electrical signal routers and is particularly directed to an electrical interface panel for providing asynchronous signals from plural connectors of a first type to plural connectors of a different type in a compact, closed housing.

BACKGROUND OF THE INVENTION

An electrical interface panel is typically used to connect a first set of cables with a second set of cables. The first set of cables typically terminate in a first connector, while a second set of cables terminate in a second connector, where the two connectors may be of different types, thus requiring an electrical interface arrangement. Cables typically connect the first connectors with the second connectors. Electrical interface arrangements of this type are becoming increasingly complex and more common with the increasing use of high speed data networks such as the Internet.

As the number of cables increase, the cable connection arrangements undergo a corresponding increase in complexity. Thus, large numbers of cables frequently interconnect one set of connectors with another set in asynchronous signal networks. This large number of electrical cables is unruly and cumbersome and is aesthetically displeasing and difficult to manage. In addition, the large number of cables and associated connections is subject to environmental degradation, such as from humidity, as well as disconnection caused by stresses on the connectors or by worker contact with the connectors.

The present invention addresses the aforementioned limitations of the prior art by providing a compact, highly reliable, easily installed electrical interface panel for routing asynchronous signals from a first set of connectors to a second set of connectors.

OBJECTS AND SUMMARY OF THE INVENTION

Accordingly, it is an object of the present invention to provide a compact electrical interface panel for routing asynchronous signals from plural input to plural output connectors.

It is another object of the present invention to provide an electrical interface between plural small computer system interface (SCSI) multi-port connectors and either plural RJ45 multi-port connectors or plural D-sub connectors.

Yet another object of the present invention is to provide asynchronous signal connectivity in a point-to-point electrical interface panel in a manner which is easily managed, safe, environmentally isolated, and highly reliable.

The present invention contemplates an electrical interface panel for routing asynchronous signals from plural input connectors to plural output connectors. The input and output connectors are attached to respective walls of a generally closed housing, with the input and output connectors connected by means of either plural cables or by a printed circuit (PC) board disposed within the housing to isolate the electrical connections from environmental degradation as well as from vibration, stress and contact by workers. This arrangement thus substantially increases the reliability of the point-to-point electrical connections and enhances worker safety. In a preferred embodiment, plural SCSI multi-port connectors are connected to either plural RJ45 multi-port connectors or to plural D-sub connectors. The electrical interface panel provides built-in cable strain relief for maintaining the cables firmly in place and perfectly aligned with the connectors. The electrical interface panel's housing is sized so as to occupy either one rack unit, i.e., 1RU, or two rack units, i.e., 2RU, and additional Rack Units depending on the number of connections to be made.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 4 is a plan view of a printed circuit (PC) board used in one embodiment of the electrical interface panel of the present invention;

FIG. 5 is a plan view of the PC board shown in FIG. 4 further illustrating plural electrical connectors connected to respective edge portions of the PC board in accordance with one embodiment of the present invention;

FIG. 6 is an elevation view of a SCSI 68 connector with which the electrical interface panel of the present invention is intended for use;

FIG. 7 is an elevation view of an RJ45 connector with which the electrical interface panel of the present invention is also intended for use.

DETAILED DESCRIPTION OF THE PREFERRED EMBODIMENTS

Figure 1:
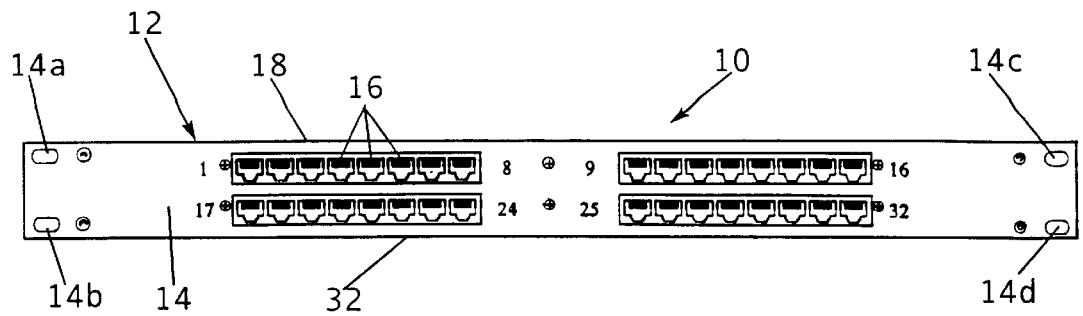
FIG. 1 is a front elevation view of one embodiment of an electrical interface panel in accordance with the principles of the present invention.
Figure 2:
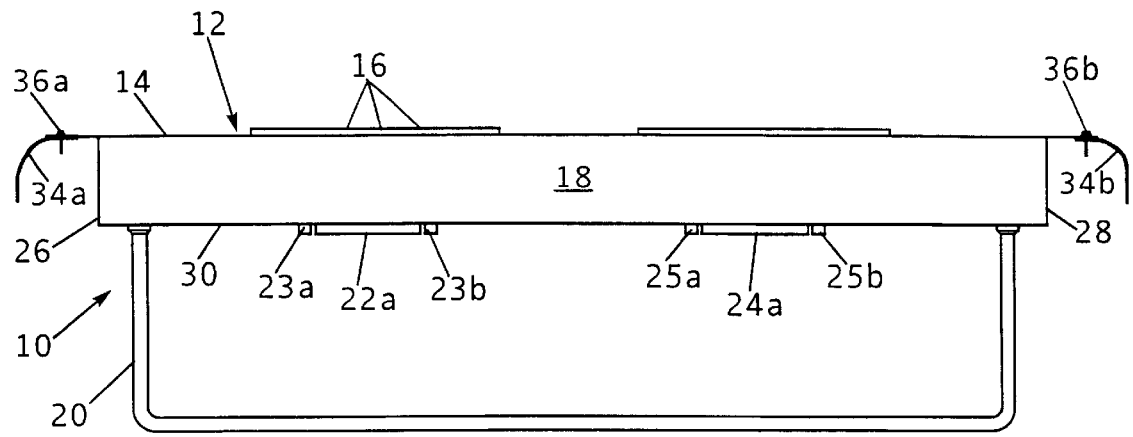
FIG. 2 is a top plan view of the inventive electrical interface panel of FIG. 1.
Figure 3:
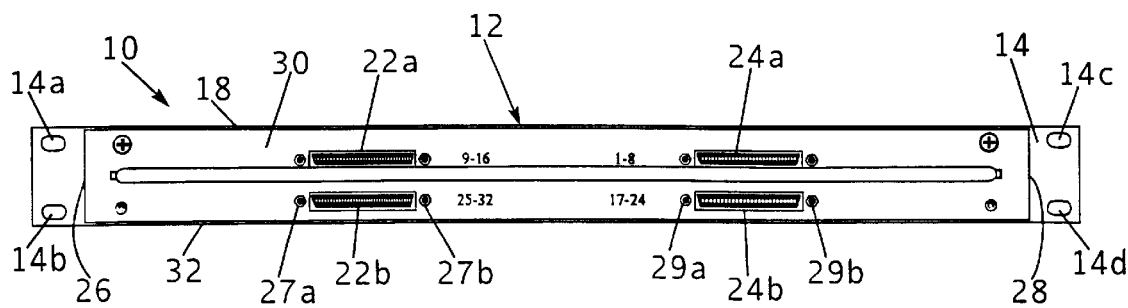
FIG. 3 is a rear elevation view of the inventive electrical interface panel of FIG. 1.

Referring to FIGS. 1, 2 and 3, there are respectively shown front elevation, top plan and rear elevation views of an electrical interface panel 10 in accordance with one embodiment of the present invention. The electrical interface panel 10 includes a generally rectangular, closed housing 12, preferably comprised of sheet metal. Housing 12 includes front and rear walls 14 and 30, top and bottom walls 18 and 32, and first and second side walls 26 and 28. Apertures 14a, 14b, 14c and 14d are each disposed in a respective corner of the housing's front wall 14 for mounting the electrical interface panel 10 to an equipment rack. Thus, FIG. 2 shows mounting holes 36a and 36b through respective apertures in the housing's front wall 14 as well as through respective apertures in first and second mounting brackets 34a and 34b. The first and second mounting brackets 34a, 34b are disposed in an equipment rack in which the electrical interface panel 10 is mounted, with the space between the first and second mounting brackets referred to as a rack unit. Thus, the electrical interface panel 10 of the present invention is adapted for positioning in and mounting to one rack unit (1RU). The housing's front wall 14 further includes plural spaced apertures arranged in a linear array, with each aperture adapted to receive in tight fitting engagement a respective one of plural RJ45 connectors 16. In the embodiment shown in FIGS. 1, 2 and 3, electrical interface panel 10 is provided with 32 RJ45 connectors 16.

Attached to the housing's rear wall 30 is a generally U-shaped strain relief bar 20. Strain relief bar 20 facilitates reducing stress on cable assemblies used to attach the asynchronous panel and reduces stress on connectors 22a, 22b, 24a, and 24b. Attached to and extending through the housing's rear wall 30 are first, second, third, and fourth SCSI multi-port connectors 22a, 22b, 24a, and 24b. The first SCSI multi-port connector 22a is connected to the housing's rear wall 30 by means of a pair of threading mounting pins 23a and 23b. Similarly, the second SCSI multi-port connector 24a is connected to the housing's rear wall 30 by means of a second pair of threaded mounting pins 25a and 25b. Similarly, the third SCSI multi-port connector 22b is connected to the housing's rear wall 30 by means of a third pair of threaded mounting pins 27a, and 27b. Similarly, the fourth SCSI multi-port connector 24b is connected to the housing's rear wall 30 by means of a fourth pair of threaded mounting pins 29a, and 29b. Each of the first, second, third, and fourth SCSI multi-port connectors 22a, 22b, 24a, and 24b is connected to plural RJ45 connectors 16 disposed on the housing's front wall 14 as described in the following paragraphs.

Referring to FIG. 4, there is shown a printed circuit (PC) board 40 for electrically connecting first and second SCSI multi-port connectors 22a, 22b, 24a, and 24b to either plural RJ45 connectors or plural D-sub multi-port connectors in accordance with one embodiment of the present invention. FIG. 4 is a plan view of a surface of the PC board 40 which includes a generally flat substrate 42 and first and second sets of pinouts 46 and 48. Each of the first and second pinouts 46, 48 is in the form of an aperture in substrate 42. Each of the first and second pinouts 46, 48 is adapted for coupling to a respective pin of an electrical connector. Also disposed in the substrate 42 of PC board 40 are third and fourth sets of pinouts 50 and 52, which also are each adapted for coupling to a respective pin of an electrical connector. Disposed about each of the first, second, third and fourth pinouts 46, 48, 50 and 52 are respective conductive portions which are coupled by means of respective conductors. Thus, each of the first pinouts 46 is electrically connected to a respective one of the third pinouts 50 by means of a respective conductor 44 on a fixed point-to-point basis. Similarly, each of the second pinouts 48 is electrically connected to a respective one of the fourth pinouts 52 by means of a respective conductor 54 also on a fixed point-to-point basis. Disposed about each of the pinouts is a conductive portion on substrate 42 which is in electrical contact with a respective one of the conductors for providing an electrically conductive path between a pair of pinouts.

Referring to FIG. 5, there is shown a connector arrangement employing PC board 40 in accordance with one aspect of the invention. Attached to one edge of the PC board 40 are connector housing 56a and 56b incorporating plural RJ45 multi-port connectors 58. This embodiment shows plural RJ45 multi-port connectors 58 coupled to the PC board 40, but the present invention also contemplates plural D-Sub connectors coupled to the PC board as described above. Each of the RJ45 multi-port connectors 58 is attached to plural electrical leads by means of a male half of the connector, as shown for the case of first and second electrical leads 38a and 38b. Connector housings 56a, 56b are rigid structures, such as of metal, and house each of the RJ45 multi-port connectors 58. Housings 56a, 56b typically incorporate eight (8) such RJ45 multi-port connectors 58. Connecting pins (not shown for simplicity) extending from connector brackets 56a, 56b and electrically coupled to a respective RJ45 multi-port connectors 58 are inserted in and electrically coupled respective one of the first or second pinouts 46, 48. An elevation view of an RJ45 connector 70 is shown in FIG. 7.

Attached to a second edge of the PC board 40 and electrically connected to the third and fourth pinouts 50 and 52 are first and second SCSI multi-port connectors 60 and 62. Shown in FIG. 6 is an elevation view of a SCSI 68 connector 64. The SCSI 68 connector 64 includes sixty-eight (68) ports 66 as well as first and second mounting apertures for attaching the connector to the electrical interface panel's housing. Extending from each of the first and second SCSI multi-port connectors 60, 62 are plural pins for connection to the third and fourth pinouts 50, 52 in the PC board's substrate 42. Each of the first and second SCSI multi-port connectors 60, 62 also is electrically connected to plural conductors, as shown for the case of conductors 39a and 39b in FIG. 5. Each of the RJ45 multi-port connectors 58 is substantially disposed within a respective connector housing 56a, 56b. Distal portions of each of the RJ45 multi-port connectors 58 extend from the electrical interface panel's housing, as do distal portions of the first and second SCSI multi-port connectors 60, 62. Thus, the connector housing 56a and 56b, PC board 40, and proximal portions of the RJ45 multi-port connectors 58 and the proximal portions of the first and second SCSI multi-port connectors 60, 62 are disposed within the housing of the electrical interface panel. It is only the distal portions of the RJ45 multi-port connectors 58 and distal portions of the first and second SCSI multi-port connectors 60, 62 which extend from the electrical interface panel's housing.

Figure 8:
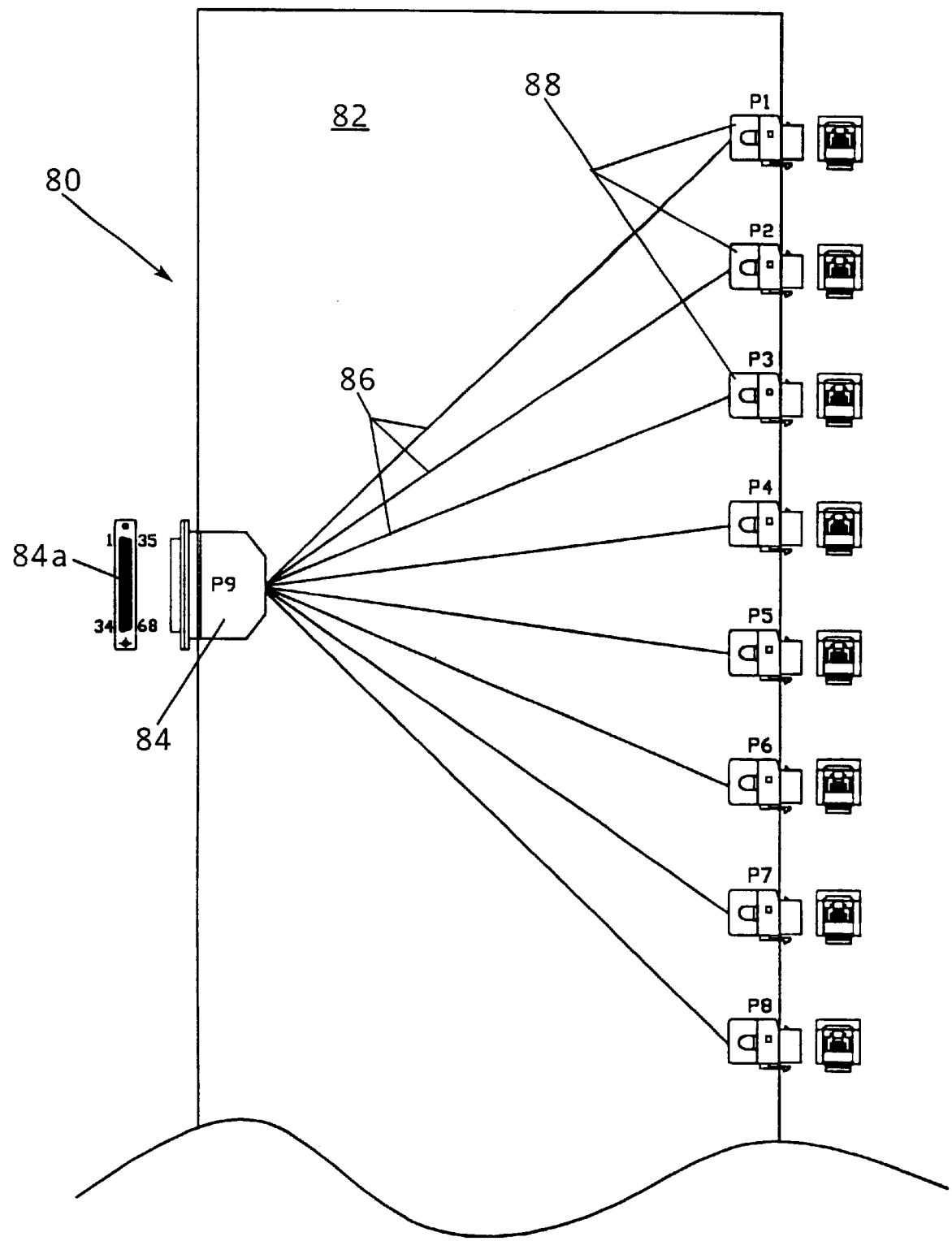
FIG. 8 is a simplified schematic diagram showing the electrical connections between a SCSI 68 connector and plural RJ45 connectors in accordance with one aspect of the present invention.

Referring to FIG. 8, there is shown a simplified schematic diagram of another electrical coupling arrangement between a SCSI multi-port connector 84 and plural D-sub multi-port connectors 88. An end portion of the SCSI multi-port connector 84 is shown for illustrative purposes as element 84a in the figure. A portion of the interface panel 80 shown in FIG. 8 includes a housing 82 as in the previously described embodiment. Plural electrical cables, or leads, 86 connect the SCSI multi-port connector 84 to plural D-sub multi-port connectors 88 in accordance with this embodiment of the invention.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. An electrical interface panel for point-to-point connection of pinouts, said electrical interface panel comprising:

a substantially closed housing having first and second opposed walls, wherein said housing is adapted for mounting in a single rack unit space by means of plural mounting apertures disposed on opposed lateral edges of one of said walls, first and second small computer system interface (SCSI) connectors each including first plural connecting pins and attached to and inserted through said first wall of said housing;

first and second pluralities of RJ45 connectors or D-sub connectors each including second plural connecting pins and attached to and inserted through said second wall of said housing; and a single printed circuit board disposed in or on said housing and having first pinouts directly connected to said first connecting pins, second pinouts directly connected to said second connecting pins, and first and second pluralities of electrical leads connecting each of said first pinouts to a respective one of said second pinouts on a fixed point-to-point basis, and wherein said first and second SCSI connectors are respectively connected to said first and second pluralities of either RJ45 connectors or D-sub connectors by said first and second pluralities of electrical leads, respectively.

2. The electrical interface panel of claim 1 wherein said single printed circuit board is generally planar and includes first and second opposed edges, and wherein said first pinouts are disposed adjacent the first edge of said single printed circuit board and said second pinouts are disposed adjacent the second opposed edge of said single printed circuit board.

3. The electrical interface panel of claim 1 wherein said housing includes top and bottom walls and plural lateral walls disposed intermediate and coupled to said top and bottom walls, and wherein said first and second walls form opposed lateral walls of said housing.

4. The electrical interface panel of claim 3 further comprising a strain relief attached to an outer portion of a lateral wall of said housing.

* * * * *

UNITED STATES PATENT AND TRADEMARK OFFICE
CERTIFICATE OF CORRECTION

PATENT NO.   : 6,302,742 B1
DATED        : October 16, 2001
INVENTOR(S)  : John Ray Berst and Kevin S. Reber It is certified that error appears in the above-identified patent and that said Letters Patent is hereby corrected as shown below:

<u>Column 2,</u>
Line 55, delete "comer" and insert -- corner --.

<u>Column 4,</u>
Line 18, delete "39aand" and insert -- 39a and --.
Line 61, delete "," and insert -- ; --.

Signed and Sealed this

Nineteenth Day of March, 2002

Attest:

*Attesting Officer*

JAMES E. ROGAN
*Director of the United States Patent and Trademark Office*